(12) United States Patent
Liu et al.

(10) Patent No.: US 8,563,974 B2
(45) Date of Patent: Oct. 22, 2013

(54) HIGH-GAIN COMPLEMENTARY INVERTER WITH AMBIPOLAR THIN FILM TRANSISTORS AND FABRICATION THEREOF

(75) Inventors: Po-Tsun Liu, Hsinchu (TW); Yi-Teh Chou, Hsinchu (TW); Li-Feng Teng, Hsinchu (TW); Chur-Shyang Fu, Hsinchu (TW); Han-Ping Shieh, Hsinchu (TW)

(73) Assignee: National Chiao Tung University, Hsinchu (TW)

( * ) Notice: Subject to any disclaimer, the term of this patent is extended or adjusted under 35 U.S.C. 154(b) by 227 days.

(21) Appl. No.: 13/195,650

(22) Filed: Aug. 1, 2011

(65) Prior Publication Data
US 2012/0298982 A1    Nov. 29, 2012

(30) Foreign Application Priority Data
May 27, 2011   (TW) .............................. 100118678 A

(51) Int. Cl.
*H01L 29/10*    (2006.01)

(52) U.S. Cl.
USPC .......................................................... 257/43

(58) Field of Classification Search
USPC ............................................................. 257/43
See application file for complete search history.

(56) References Cited

U.S. PATENT DOCUMENTS

2009/0134389 A1*   5/2009   Matsunaga ..................... 257/43

* cited by examiner

*Primary Examiner* — Anthony Ho
(74) *Attorney, Agent, or Firm* — Stites & Harbison PLLC; Juan Carlos A. Marquez, Esq.

(57) ABSTRACT

The present invention relates to a high gain complementary inverter with ambipolar thin film transistors and fabrication thereof, comprising: a gate layer, a silica layer, a first active layer, a first source, a first drain, a second active layer, a second source and a second drain for fabrication cost and complexity reduction.

10 Claims, 8 Drawing Sheets

|  | 250°C | 350°C | 400°C |
|---|---|---|---|
| gain of the first quadrant | 62 | 58 | 65 |
| operation voltage of the first quadrant (V) | 35.5 | 13.5 | 9 |
| gain of the third quadrant | 55.74 | 73.1 | 55.5 |
| operation voltage of the first quadrant (V) | -6.5 | -29 | -39 |

FIG. 4

HIGH-GAIN COMPLEMENTARY INVERTER WITH AMBIPOLAR THIN FILM TRANSISTORS AND FABRICATION THEREOF

TECHNICAL FIELD

The present invention relates to a complementary inverter with ambipolar thin film transistors, and more particularly, to a high gain complementary inverter with ambipolar thin film transistors that can be used in semiconductor and photoelectronic industry, for example, a flat panel display.

TECHNICAL BACKGROUND

With rapid development of the flat panel display, the application of the thin film transistor (TFT) has achieved great recognition. The thin-film element is configured to replace with the external integrated circuit (IC) module so as to completely manufacture circuits with various functions on the system on panel (SOP) in flat panel display. This technology is widely developed for achieving some goals, for example, the product with thin, light and low cost and the high manufacturing yield.

In SOP technology, most function circuits composes of the unit circuit comprising TFT elements, for example, the phase inverter (or simply called inverter), the logic gate or the memory circuit, etc. The phase inverter is a key circuit unit for the most electronic circuits. The most common circuit unit of the thin-film phase inverter composes of a p-channel TFT and a n-channel TFT. When the signal with high level (1) inputs into the input terminal, the n-channel semiconductor transistor turns on so as to output the signal with low level (0). Oppositely, when the signal with low level (0) inputs into the input terminal, the p-channel semiconductor transistor turns on so as to output the signal with high level (1). As far as the function of the phase inverter is concerned, if the transmission rate of the n-type or p-type thin film transistor element with single channel is low, it will cause the decrease of the output gain of the entire inverter; Alternatively, the characteristic of the n-type or p-type thin film transistor element with single channel is not good, for example, the larger initial voltage, it will also cause the operation voltage of the inverter is more larger. Consequently, the conventional inverter circuit composing of the p-type and n-type thin film transistor with single channel must uses different manufactures and different element size to achieve the optimal circuit. Moreover, in the known technology, the material of the active layer used in the thin film semiconductor element used for manufacturing the glass substrate or the display panel is almost the inorganic amorphous or polysilicon material. However, the amorphous thin film has disadvantages as follows: the lower carrier mobility, the larger operation voltage and the unsteady electric characteristics. The polysilicon thin film has disadvantages as follows: the higher cost, the complicated manufacture and the device uniformity is not good and it difficult to perform mass generation. Thereby, it is a great challenge to develop the SOP technology.

TECHNICAL SUMMARY

In the known technology, the material of the active layer used in the thin film semiconductor element used for manufacturing the glass substrate or the display panel is almost the inorganic amorphous or polysilicon material. However, the amorphous thin film has disadvantages as follows: the lower carrier mobility, the larger operation voltage and the unsteady electric characteristics. The polysilicon thin film has disadvantages as follows: the higher cost, the complicated manufacture and the device uniformity is not good. In order to resolve the problems mentioned above, in one embodiment, the present invention provides an ambipolar thin film transistor, comprising: a gate layer, wherein material of the gate layer is low-resistivity Si or metal conductor, and wherein the metal conductor is aluminum (Al), molybdenum (Mo), titanium (Ti), wolfram(W) or the related alloys; a silica layer, forming on the gate layer; an active layer, forming on the silica layer, wherein the active layer is formed by stacking up a n-type semiconductor thin film and a p-type semiconductor thin film; a source, forming on the gate layer and connecting to one side of the active layer; and a drain, forming on the gate layer, connecting to another side of the active layer and corresponding to the source.

In another embodiment, the present invention provides a high gain complementary inverter with ambipolar thin film transistors, comprising: a gate layer, wherein material of the gate layer is low-resistivity Si or metal conductor, and wherein the metal conductor is aluminum (Al), molybdenum (Mo), titanium (Ti), wolfram (W) or the related alloys; a silica layer, forming on the gate layer; a first active layer, forming on the silica layer, wherein the active layer is formed by stacking up a first n-type semiconductor thin film and a first p-type semiconductor thin film; a first source, forming on the gate layer and connecting to one side of the first active layer; a first drain, forming on the gate layer, connecting to another side of the first active layer and corresponding to the first source; a second active layer, forming on the silica layer, wherein the second active layer is formed by stacking up a second n-type semiconductor thin film and a second p-type semiconductor thin film; a second source, forming on the gate layer and connecting to one side of the second active layer; and a second drain, forming on the gate layer, connecting to another side of the second active layer and corresponding to the second source.

Further scope of applicability of the present application will become more apparent from the detailed description given hereinafter. However, it should be understood that the detailed description and specific examples, while indicating exemplary embodiments of the disclosure, are given by way of illustration only, since various changes and modifications within the spirit and scope of the disclosure will become apparent to those skilled in the art from this detailed description.

BRIEF DESCRIPTION OF THE DRAWINGS

The present disclosure will become more fully understood from the detailed description given herein below and the accompanying drawings which are given by way of illustration only, and thus are not limitative of the present disclosure and wherein:

FIG. 4 shows a table of the operation voltage and gain of a high gain complementary inverter with ambipolar thin film transistors operating in the first quadrant and the third quadrant;

DESCRIPTION OF THE EXEMPLARY EMBODIMENTS

For your esteemed members of reviewing committee to further understand and recognize the fulfilled functions and structural characteristics of the disclosure, several exemplary embodiments cooperating with detailed description are presented as the follows.

Figure 1:
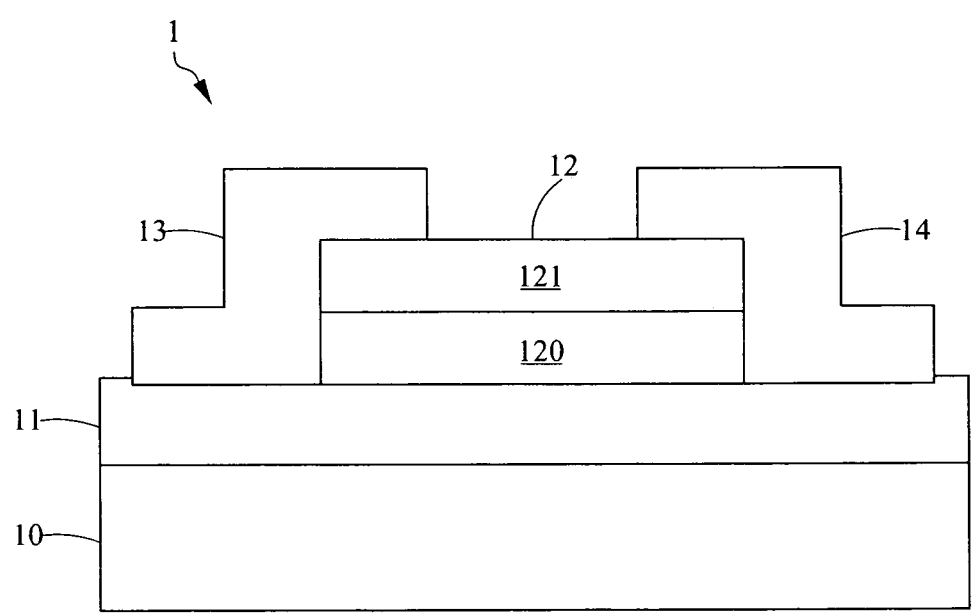
FIG. 1 is a schematic diagram showing an ambipolar thin film transistor 1 according to one embodiment of the present invention.

FIG. 1 is a schematic diagram showing an ambipolar thin film transistor 1 according to one embodiment of the present invention. The ambipolar thin film transistor 1 comprises: a gate layer 10, wherein material of the gate layer 10 is low-resistivity Si or metal conductor, and wherein the metal conductor is aluminum (Al), molybdenum (Mo), titanium (Ti), wolfram (W) or the related alloys; a silica layer 11, forming on the gate layer 10; an active layer 12, forming on the silica layer 11, wherein the active layer 12 is formed by stacking up a n-type semiconductor thin film 120 and a p-type semiconductor thin film 121. The active layer 12 simultaneously has the n-type and p-type thin films, so electrons or holes may be transmitted in the active layer. Specifically, material of the n-type semiconductor thin film is an amorphous oxide semiconductor, for example, an amorphous InGaZnO (a-IGZO), amorphous InZnO (a-IZO), amorphous AlZnTinO (a-AZTO), amorphous HfInZnO (a-HIZO), amorphous SiInZnO (a-SIZO), amorphous ZnTinO (a-ZTO), amorphous ZrZnTinO (a-ZrZTO), etc. Material of the p-type semiconductor thin film is pentacene or 3-hexylthiophene (P3HT); a source 13, forming on the gate layer 10 and connecting to one side of the active layer 12; and a drain 14, forming on the gate layer 10, connecting to another side of the active layer 12 and corresponding to the source 13.

Figure 2A:
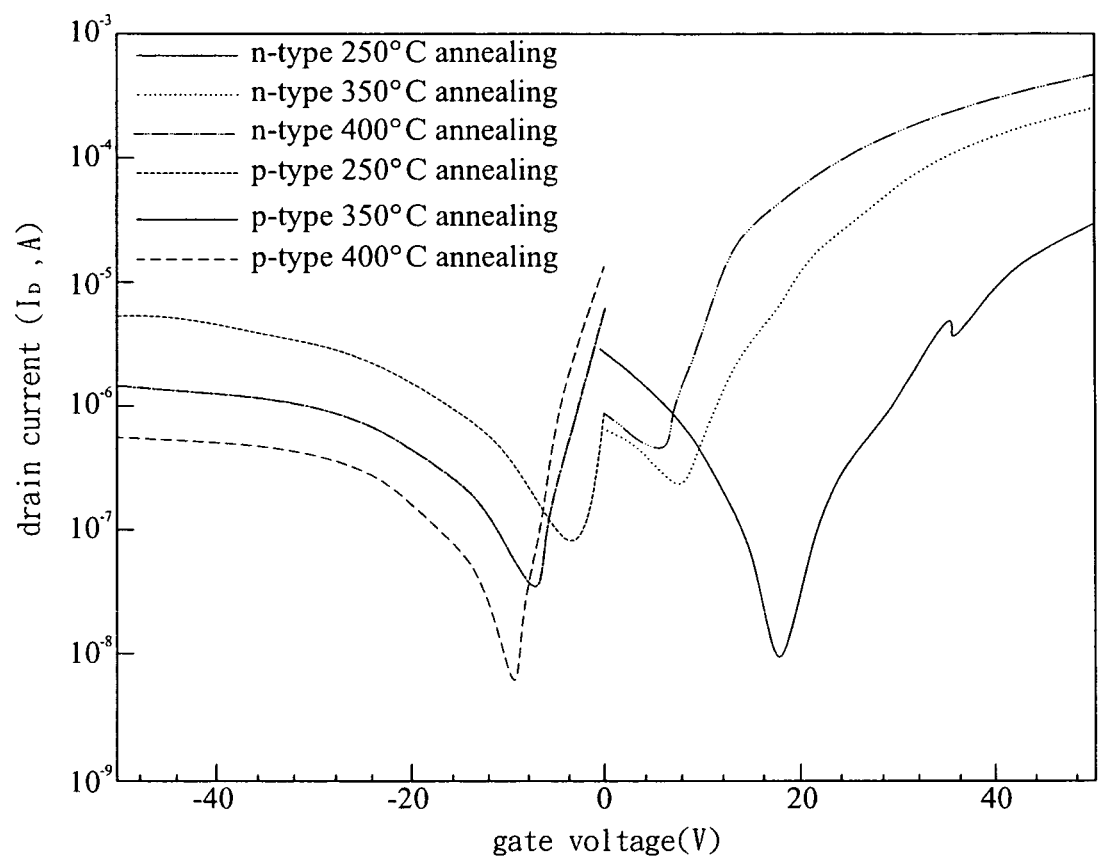
FIG. 2A illustrates characteristic curves of the n-type semiconductor thin film after the n-type semiconductor thin film is processed by three different temperatures of the post thermal annealing.

Referring to FIG. 2A, the n-type semiconductor thin film 120 is processed by using the technology of the post thermal annealing so as to change electron concentration of the amorphous InGaZnO (a-IGZO). FIG. 2A illustrates characteristic curves of the n-type semiconductor thin film after the n-type semiconductor thin film is processed by three different temperatures of the post thermal annealing. Further, the process of the post thermal annealing may improve the operation voltage and the carrier mobility. As shown in FIG. 2A, it obviously decreases the operation voltage of the n-type semiconductor thin film 120 as the raise of the temperature of the post thermal annealing. In other words, the carrier concentration of the n-type semiconductor thin film 120 is changed by changing the temperature of the post thermal annealing so as to control the operation voltage, and wherein the temperature range is 150~650° C. In the embodiment, the temperature range is 250~400° C.

Figure 2B:
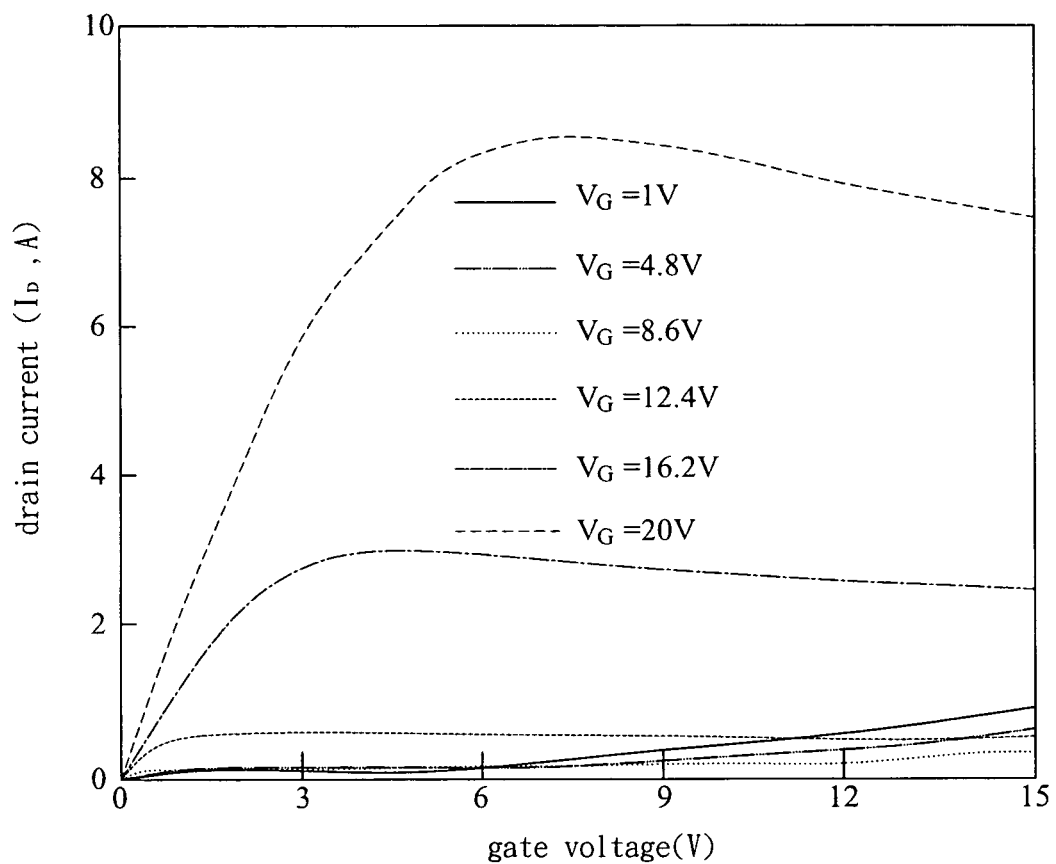
FIG. 2B illustrates characteristic curves of the ambipolar thin film transistor operating in n-channel.
Figure 2C:
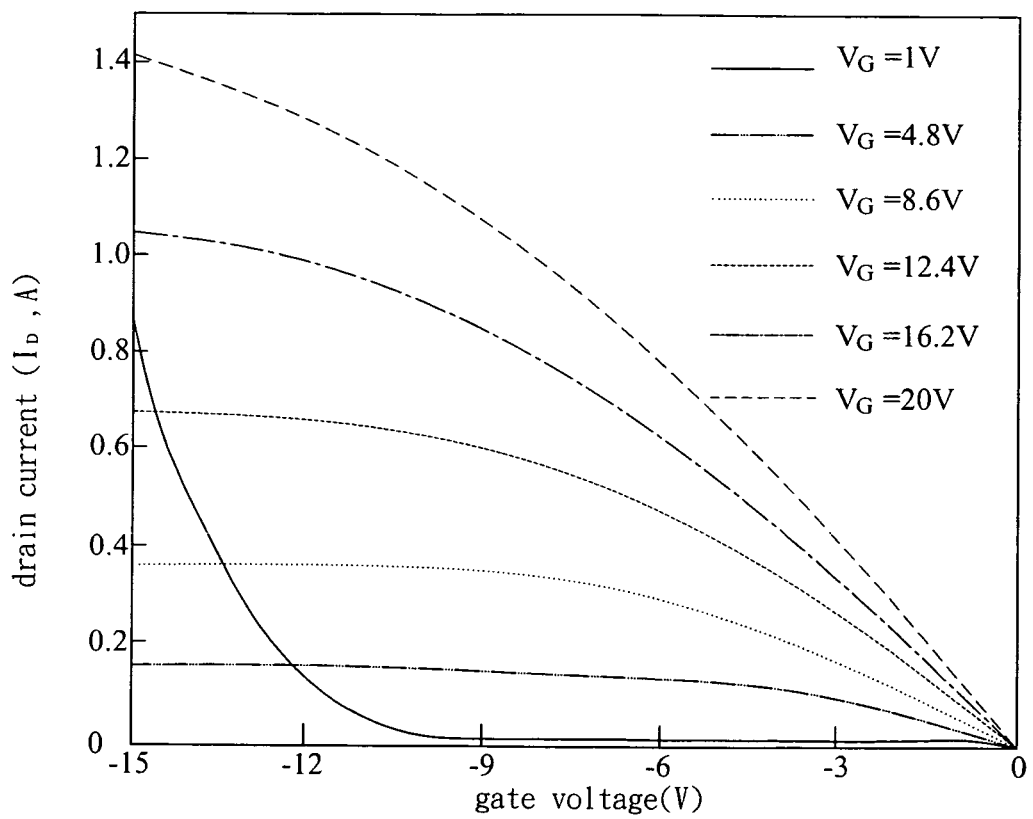
FIG. 2C illustrates characteristic curves of the ambipolar thin film transistor operating in P-channel.

As shown in FIGS. 2B and 2C, it proves that an ambipolar thin film transistor provided by the present invention has the bipolar conduction ability.

Figure 3A:
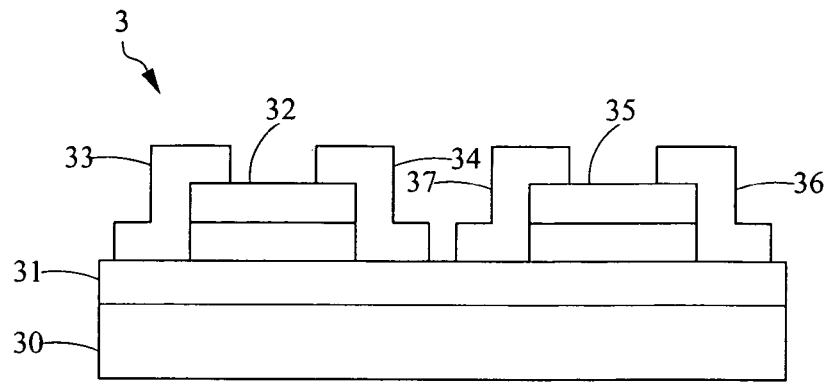
FIG. 3A illustrates a high gain complementary inverter with ambipolar thin film transistors according to one embodiment of the present invention.

FIG. 3A illustrates a high gain complementary inverter 3 with ambipolar thin film transistors according to one embodiment of the present invention. The high gain complementary inverter 3 with ambipolar thin film transistors comprises: a gate layer 30, wherein material of the gate layer 30 is low-resistivity Si or metal conductor, and wherein the metal conductor is aluminum (Al), molybdenum (Mo), titanium (Ti), wolfram (W) or the related alloys; a silica layer 31, forming on the gate layer 30; an first active layer 32, forming on the silica layer 31, wherein the active layer 32 is formed by stacking up a first n-type semiconductor thin film 320 and a first p-type semiconductor thin film 321. The first active layer 32 simultaneously has the n-type and p-type thin films, so electrons or holes may be transmitted in the active layer. Specifically, material of the first n-type semiconductor thin film 320 is an amorphous oxide semiconductor, for example, an amorphous InGaZnO (a-IGZO), amorphous InZnO (a-IZO), amorphous AlZnTinO (a-AZTO), amorphous HfInZnO (a-HIZO), amorphous SiInZnO (a-SIZO), amorphous ZnTinO (a-ZTO), amorphous ZrZnTinO (a-ZrZTO), etc. Material of the first p-type semiconductor thin film 321 is pentacene or 3-hexylthiophene (P3HT); a first source 33, forming on the gate layer 30 and connecting to one side of the first active layer 32; and a first drain 34, forming on the gate layer 30, connecting to another side of the first active layer 32 and corresponding to the source 33.

an second active layer 35, forming on the silica layer 31, wherein the active layer 35 is formed by stacking up a second n-type semiconductor thin film 350 and a second p-type semiconductor thin film 351. The second active layer 35 simultaneously has the n-type and p-type thin films, so electrons or holes may be transmitted in the active layer. Specifically, material of the second n-type semiconductor thin film 350 is an amorphous oxide semiconductor, for example, an amorphous InGaZnO (a-IGZO), amorphous InZnO (a-IZO), amorphous AlZnTinO (a-AZTO), amorphous HfInZnO (a-HIZO), amorphous SiInZnO (a-SIZO), amorphous ZnTinO (a-ZTO), amorphous ZrZnTinO (a-ZrZTO), etc. Material of the second p-type semiconductor thin film 351 is pentacene or 3-hexylthiophene (P3HT); a second source 36, forming on the gate layer 30 and connecting to one side of the second active layer 35; and a second drain 37, forming on the gate layer 30, connecting to another side of the first active layer 35 and corresponding to the second source 36.

Figure 3B:
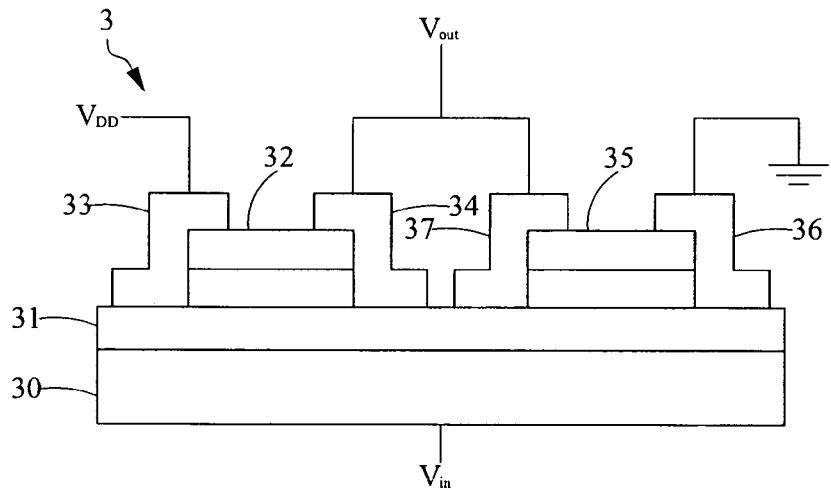
FIG. 3B schematically illustrates line connection of the high gain complementary inverter with ambipolar thin film transistors.
Figure 3C:
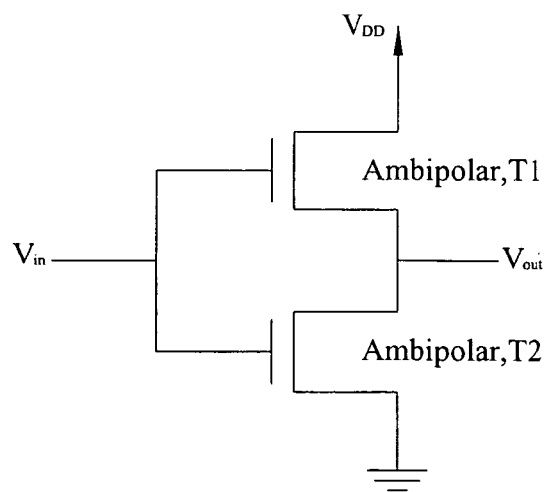
FIG. 3C illustrates an equivalent circuit of FIG. 3B.
Figure 5A:
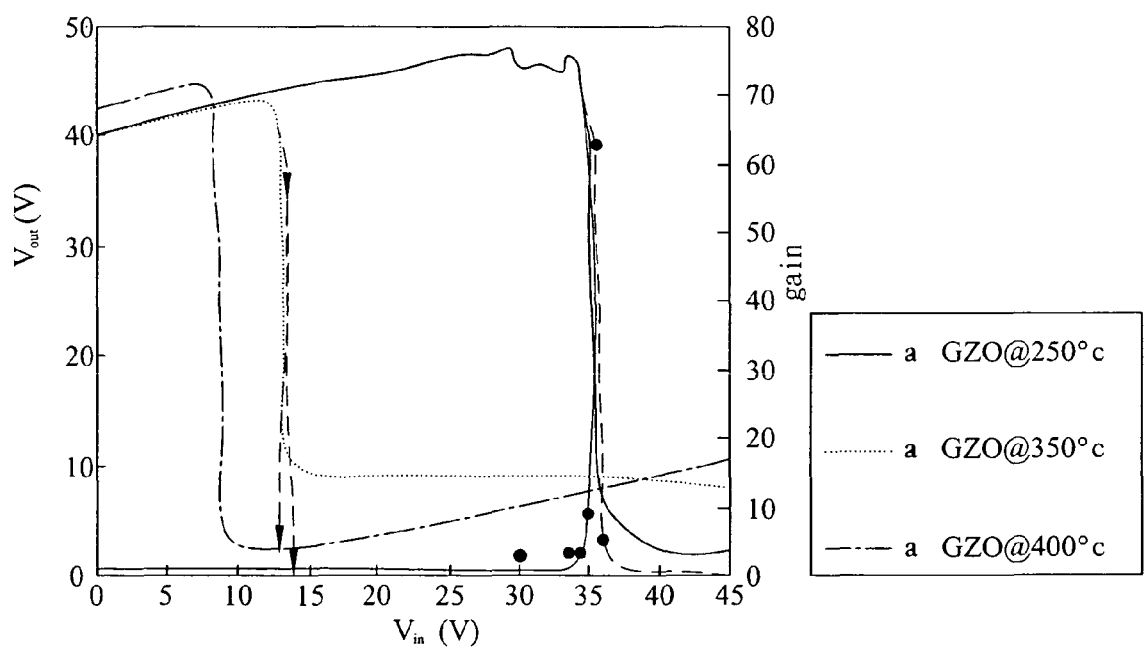
FIG. 5A is a output gain diagram of a high gain complementary inverter with ambipolar thin film transistors operating in first quadrant (the gate voltage>0)
Figure 5B:
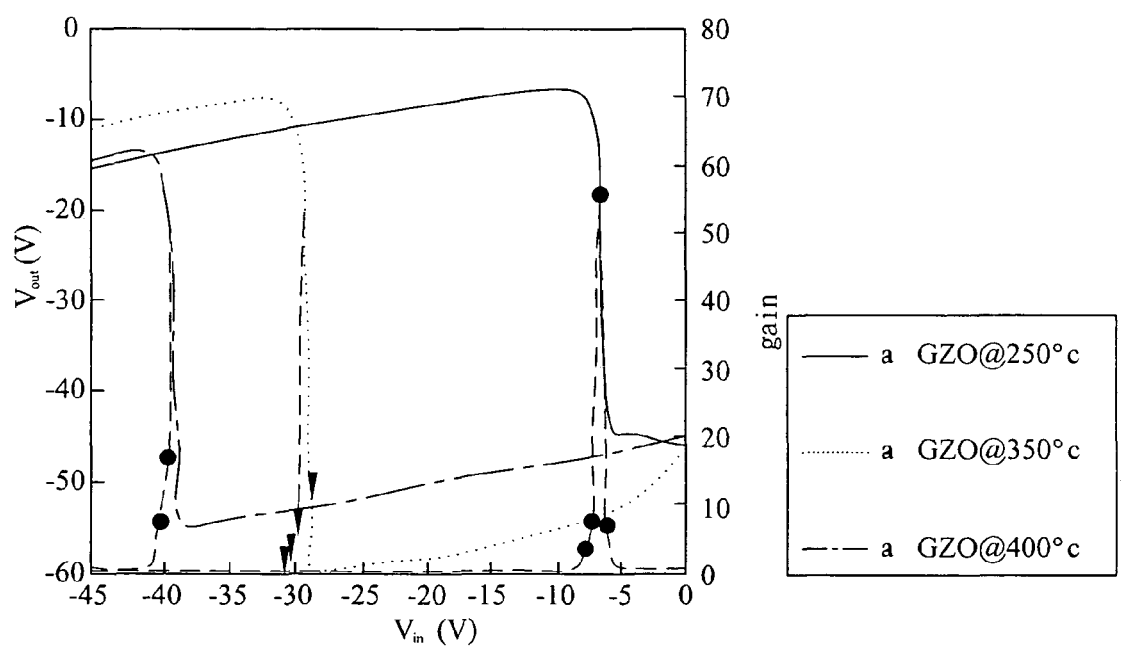
FIG. 5B is an output gain diagram of a high gain complementary inverter with ambipolar thin film transistors operating in first quadrant (the gate voltage<0).

FIG. 3B schematically illustrates line connection of the high gain complementary inverter with ambipolar thin film transistors. Specifically, the first source 33 is connected to the voltage $V_{DD}$ and the second source 36 is connected to the ground. The signal $V_{in}$ inputs into the gate layer 30, and the signal $V_{out}$ outputs from the second drain 34, which is connected to the second drain 37. FIG. 3C illustrates an equivalent circuit of FIG. 3B.

With respect to the above description then, it is to be realized that the optimum dimensional relationships for the parts of the disclosure, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present disclosure.

What is claimed is:

1. An ambipolar thin film transistor, comprising:
   a gate layer, wherein material of the gate layer is low-resistivity Si or metal conductor;

a silica layer, forming on the gate layer;

an active layer, forming on the silica layer, wherein the active layer is formed by stacking up a n-type semiconductor thin film and a p-type semiconductor thin film;

a source, forming on the gate layer and connecting to one side of the active layer; and a drain, forming on the gate layer, connecting to another side of the active layer and corresponding to the source, wherein carrier concentration of the n-type semiconductor thin film is changed by changing temperature of the post thermal annealing so as to control the operation voltage, and wherein the temperature range is 150~650° C.

2. The ambipolar thin film transistor of claim 1, wherein the metal conductor is aluminum (Al), molybdenum (Mo), titanium (Ti), wolfram(W) or the related alloys.

3. The ambipolar thin film transistor of claim 1, wherein material of the n-type semiconductor thin film is an amorphous oxide semiconductor.

4. The ambipolar thin film transistor of claim 1, wherein material of the n-type semiconductor thin film is an amorphous InGaZnO (a-IGZO), amorphous InZnO (a-IZO), amorphous AlZnTinO (a-AZTO) or amorphous HfInZnO (a-HIZO) or amorphous SiInZnO (a-SIZO) or amorphous ZnTinO (a-ZTO) or amorphous ZrZnTinO (a-ZrZTO).

5. The ambipolar thin film transistor of claim 1, wherein material of the p-type semiconductor thin film is pentacene or 3-hexylthiophene (P3HT).

6. A high gain complementary inverter with ambipolar thin film transistors, comprising:

a gate layer, wherein material of the gate layer is low-resistivity Si or metal conductor;

a silica layer, forming on the gate layer;

a first active layer, forming on the silica layer, wherein the active layer is formed by stacking up a first n-type semiconductor thin film and a first p-type semiconductor thin film;

a first source, forming on the gate layer and connecting to one side of the first active layer;

a first drain, forming on the gate layer, connecting to another side of the first active layer and corresponding to the first source;

a second active layer, forming on the silica layer, wherein the second active layer is formed by stacking up a second n-type semiconductor thin film and a second p-type semiconductor thin film;

a second source, forming on the gate layer and connecting to one side of the second active layer; and a second drain, forming on the gate layer, connecting to another side of the second active layer and corresponding to the second source, wherein carrier concentration of the n-type semiconductor thin film is changed by changing temperature of the post thermal annealing so as to control the operation voltage, and wherein the temperature range is 150~650° C.

7. The ambipolar thin film transistor of claim 6, wherein the metal conductor is aluminum (Al), molybdenum (Mo), titanium (Ti), wolfram(W) or the related alloys.

8. The ambipolar thin film transistor of claim 6, wherein material of the first and second n-type semiconductor thin films are amorphous oxide semiconductors.

9. The ambipolar thin film transistor of claim 6, wherein material of the n-type semiconductor thin film is an amorphous InGaZnO (a-IGZO), amorphous InZnO (a-IZO), amorphous AlZnTinO (a-AZTO) or amorphous HfInZnO (a-HIZO) or amorphous SiInZnO (a-SIZO) or amorphous ZnTinO (a-ZTO) or amorphous ZrZnTinO (a-ZrZTO).

10. The ambipolar thin film transistor of claim 6, wherein material of the first and second p-type semiconductors thin film are pentacene or 3-hexylthiophene (P3HT).

* * * * *